US00RE42180E

(19) United States
(12) Reissued Patent
Oyamatsu et al.

(10) Patent Number: US RE42,180 E
(45) Date of Reissued Patent: Mar. 1, 2011

(54) SEMICONDUCTOR DEVICE HAVING METAL SILICIDE LAYER ON SOURCE/DRAIN REGION AND GATE ELECTRODE AND METHOD OF MANUFACTURING THE SAME

(75) Inventors: Hisato Oyamatsu, Yokohama (JP); Kenji Honda, Yokohoma (JP)

(73) Assignee: Kabushiki Kaisha Toshiba, Tokyo (JP)

(21) Appl. No.: 12/212,105

(22) Filed: Sep. 17, 2008

Related U.S. Patent Documents

Reissue of:
(64) Patent No.: 7,176,536
Issued: Feb. 13, 2007
Appl. No.: 10/837,748
Filed: May 4, 2004

(30) Foreign Application Priority Data

Nov. 14, 2003 (JP) ..... 2003-385425

(51) Int. Cl.
*H01L 31/113* (2006.01)
*H01L 29/76* (2006.01)

(52) U.S. Cl. ..... 257/392; 257/300; 257/93; 257/E27.084; 257/E51.006; 438/199; 438/683

(58) Field of Classification Search ..... 257/392, 257/300, 93, E27.084
See application file for complete search history.

(56) References Cited

U.S. PATENT DOCUMENTS

| | | | |
|---|---|---|---|
| 6,180,469 | B1 | 1/2001 | Pramanick et al. |
| 6,204,539 | B1 | 3/2001 | Oyamatsu |
| 6,410,376 | B1 | 6/2002 | Ng et al. |
| 6,461,906 | B1 | 10/2002 | Lung |

FOREIGN PATENT DOCUMENTS

| | | |
|---|---|---|
| JP | 2000-91568 A | 3/2000 |
| JP | 2000-91568 | 3/2000 |

*Primary Examiner*—Hoai v Pham
*Assistant Examiner*—Elias Ullah
(74) *Attorney, Agent, or Firm*—Oblon, Spivak, McClelland, Maier & Neustadt, L.L.P.

(57) ABSTRACT

A semiconductor device includes a semiconductor substrate, an element-isolating region formed in the semiconductor substrate, a real element region formed in the semiconductor substrate and outside the element-isolating region and having a metal silicide layer formed on the surface thereof, and a dummy element region formed in the semiconductor substrate and outside the element-isolating region and having a metal silicide layer formed on the surface thereof. The ratio of the sum of pattern areas of the real element region and dummy element region occupied in a 1 μm-square range of interest including the element region is 25% or more.

50 Claims, 8 Drawing Sheets

SEMICONDUCTOR DEVICE HAVING METAL SILICIDE LAYER ON SOURCE/DRAIN REGION AND GATE ELECTRODE AND METHOD OF MANUFACTURING THE SAME

Matter enclosed in heavy brackets [ ] appears in the original patent but forms no part of this reissue specification; matter printed in italics indicates the additions made by reissue.

CROSS-REFERENCE TO RELATED APPLICATIONS

This application is based upon and claims the benefit of priority from the prior Japanese Patent Application No. 2003-385425, filed Nov. 14, 2003, the entire contents of which are incorporated herein by reference.

BACKGROUND OF THE INVENTION

1. Field of the Invention

The present invention relates to a semiconductor device and a method of manufacturing the semiconductor device, and more particularly, to a semiconductor device having a metal silicide layer on an element region and a method of manufacturing the semiconductor device. For example, the present invention is applied to a complementary metal-oxide-semiconductor (CMOS) logic large-scale integration (LSI).

2. Description of the Related Art

For example, in the CMOS logic LSI, a self-aligned silicide (salicide) technique is used to suppress a parasitic resistance, which increases as a device is miniaturized. In the salicide technique, a reaction product between a metal and a semiconductor such as Si, namely, a silicide compound (hereinafter, referred to as a "metal silicide"), is formed on the source/drain region (an impurity diffusion layer formed in a semiconductor substrate) of a metal oxide semiconductor field-effect transistor (MOSFET) and on the gate electrode formed of a polycrystalline Si. By virtue of the presence of the metal silicide, the resistivity of each of the source/drain region and the gate electrode can be reduced. In this case, the metal to be used in the metal silicide is chosen based on a desired resistance value in consideration of conditions such as a thermal design of a CMOS process, the dimension of the gate electrode, and the depth of the diffusion layer.

Incidentally, in a CMOS technique developed after a 65 nm-node technology, a low temperature processing is required for a process forming a metal silicide in order to suppress a metal material from causing thermal diffusion, thereby suppressing contact current leakage taking place in the impurity diffusion layer and in order to suppress the doped n-type and p-type impurities from being activated. To reduce the temperature, attention has been focused on Ni. This is because Ni monosilicide can reduce the resistivity, unlike Ti and Co. Therefore, Ni is a metal material, which attains film formation at low temperature.

However, the diffusion coefficient of Ni in Si is large, which means that the chemical reaction between Si and Ni proceeds while Ni is being diffused in Si during the silicide formation process. Accordingly, when unreacted Ni is present excessively around the reaction region, the thickness of a Ni film around the reaction region increases. When a silicide is formed, excessive Ni is diffused into the element region, with the result that a silicide reaction excessively takes place in the contact region. It follows that contact current leakage takes place in the gate electrode or the impurity diffusion layer in the source/drain region. In short, current leakage occurs due to the presence of a metal silicide formed in the contact region.

When a Ni silicide is formed on the gate electrode and the source/drain region of a MOSFET by a conventional salicide technique, contact current leakage sometimes occurs depending upon the area ratio between the silicide reaction region, which is formed on the gate electrode and the source/drain region, and the silicide unreaction region, which is formed on a shallow trench isolation (STI).

FIG. 1 is a schematic plan view showing a pattern where Ni-silicide is formed in a relatively large element region (AA) 211 of an STI region 201 of a semiconductor substrate. FIG. 2 shows a schematic sectional view of the pattern. Similarly, FIG. 3 shows a schematic plan view showing a pattern where Ni-silicide is formed in a small element region (AA) 212 isolated like an island in a relatively large STI region 201 of the substrate. FIG. 4 is a schematic sectional view of the pattern.

In FIGS. 1 to 4, reference numerals 200, 201, 202, 203 and 204 denote an n-type Si substrate, STI region, p-well, $n^+$-diffusion layer, and Ni-silicide, respectively.

As shown in FIGS. 1 and 2, when the Ni silicide 204 is formed in the relative large element region 211, there is no problem since the chemical reaction of Ni proceeds uniformly in the element region 211. Whereas, as shown in FIGS. 3 and 4, when the Ni silicide 204 is formed in the small element isolation region 212 which is discretely present like an island in the relatively large STI region 201, excess Ni present in the STI 201 (unreaction region) around the element region 212 diffuses into the element region 212 during processing, with the result that an excessive silicide reaction proceeds in the depth direction of the contact region, causing contact current leakage.

Note that U.S. Pat. No. 6,180,469 discloses a technique for reducing contact current leakage and resistance. The technique includes selectively forming a Ni layer on the surfaces of the gate electrode and the source/drain region by electroless plating, doping N ions in the Ni layer to form a barrier layer, which divides the Ni layer into upper and lower layers, and applying heat treatment to the lower Ni layer, thereby converting only the lower Ni layer into a silicide layer.

As described, a conventional semiconductor device has a problem in that when Ni silicide is formed in the element region surrounded by the STI by the salicide technique, more specifically, in the element region formed discretely like an island in a large STI region, Ni excessively present in an unreaction region diffuses into the element region during the silicide process, suppressing an excessive silicide reaction in the contact region, thereby causing contact current leakage.

BRIEF SUMMARY OF THE INVENTION

According to an aspect of the present invention, there is provided a semiconductor device including:

a semiconductor substrate;

an element-isolating region formed in the semiconductor substrate; and a plurality of element regions formed in the semiconductor substrate and outside the element-isolating region and having a metal silicide layer formed on the surface thereof, the plurality of element regions including a real element region and at least one dummy element region, in which the ratio of the sum of pattern areas of the real element region and said at least one dummy element region occupied in a 1 μm-square range of interest including the element region is 25% or more.

According to another aspect of the present invention, there is provided a method of manufacturing a semiconductor device including:

forming an element region surrounded by an element-isolating region in a semiconductor region;

depositing a metal layer over an entire surface of the semiconductor region;

removing part of the metal layer on the element isolating thereby setting the ratio of the sum of pattern areas of the metal layer formed on the element region and element-isolating region occupied in a 1 μm-square range of interest including the element region at 25% or more; and performing heat processing to form a metal silicide layer including the metal layer on the element-isolating region.

DETAILED DESCRIPTION OF THE INVENTION

<Semiconductor Device and Manufacturing Method of First Embodiment>

Figure 1:
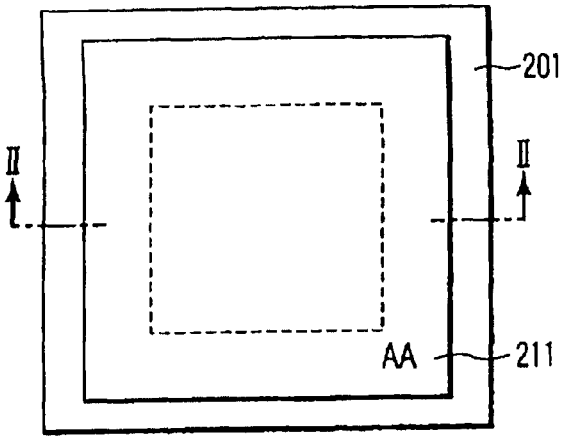
FIG. 1 PRIOR ART
FIG. 1 is a schematic plan view showing a pattern where Ni-silicide is formed in a relatively large element region within the STI of a semiconductor substrate.
Figure 2:
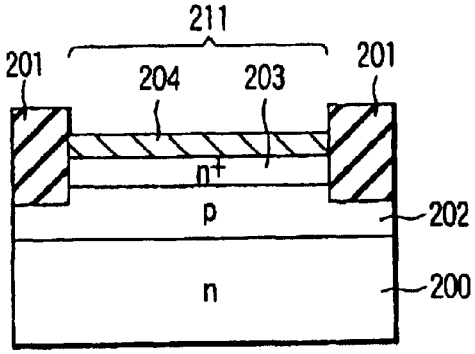
FIG. 2 PRIOR ART
FIG. 2 is a sectional view of the pattern of FIG. 1.
Figure 3:
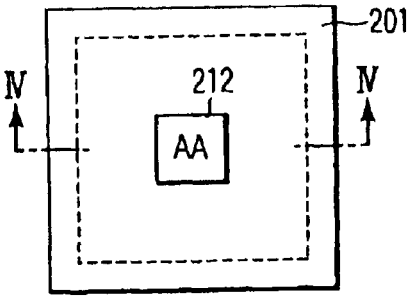
FIG. 3 PRIOR ART
FIG. 3 is a schematic plan view showing a pattern where Ni-silicide is formed in a small element region discretely formed like an island within the relatively large STI of a semiconductor substrate.
Figure 4:
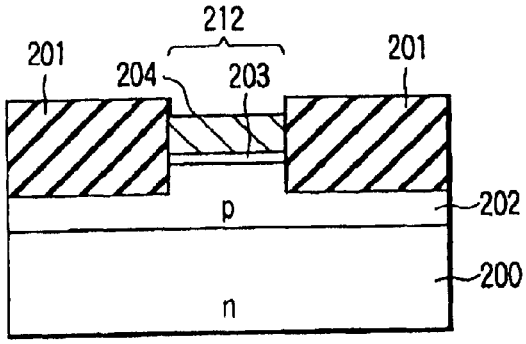
FIG. 4 PRIOR ART
FIG. 4 is a sectional view of the pattern of FIG. 3.
Figure 5:
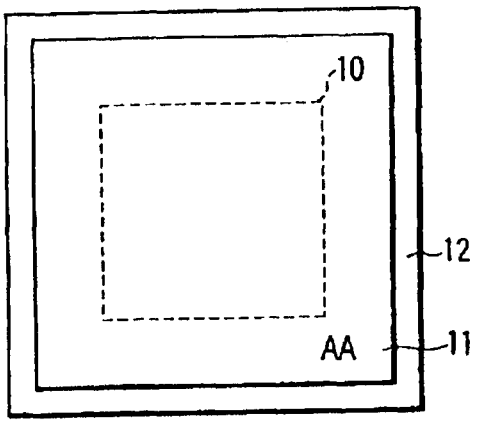
FIG. 5 is a plan view of a pattern showing part of a memory and logic embedded CMOS LSI according to a first embodiment of the present invention.
Figure 6:
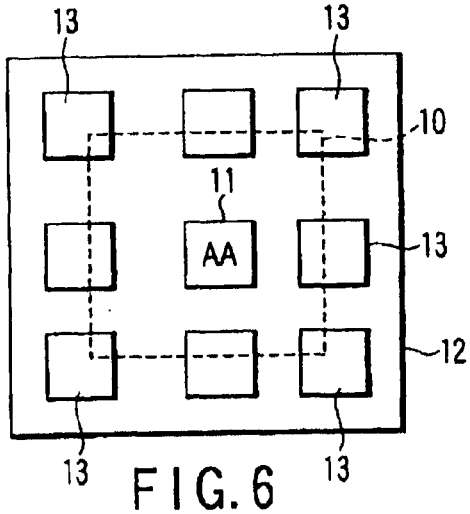
FIG. 6 is a plan view of a pattern showing different part of a memory and logic embedded CMOS LSI according to the first embodiment of the present invention.

FIGS. 5 and 6 are schematic views respectively showing two different element regions formed on the semiconductor substrate in a memory and logic embedded CMOS LSI according to the first embodiment of the present invention.

In FIGS. 5 and 6, a region 10 drawn by a broken line is a 1 μm-square region of interest in the semiconductor substrate.

In FIG. 5, a real element region 11 having a pattern area larger than that of the range of interest 10 is surrounded by an STI 12; whereas, in FIG. 6, the real element region 11 and the dummy element regions 13 having the same pattern areas and smaller than that of the region of interest 10, are arranged lengthwise and crosswise at regular intervals and surrounded by an STI 12. In the case shown in FIG. 6, the ratio of the sum of pattern areas of the real element region 11 and the dummy element regions 13 occupied in the range of interest 10 is about 25%. In each of the real element region 11 and dummy element region 13, an MOSFET is formed and a metal silicide layer is formed on the surface of each region, as described later.

Figure 7:
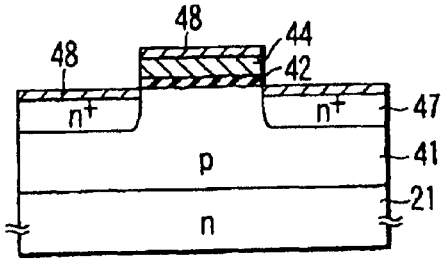
FIG. 7 is a sectional view showing a basic structure of a MOSFET formed in the element region and the dummy element region of FIG. 6.

FIG. 7 is a schematic view of the basic structure of an MOSFET to be formed in the real element region 11 and the dummy element regions 13 of FIG. 6.

On an n-type Si substrate 21, a p-well 41 is formed in which the real element region 11 and the dummy element regions 13 shown in FIG. 6 are to be formed. In the surface region of the p-well 41, an impurity diffusion layer 47 for the source/drain region of the MOSFET is formed. On a channel region of the p-well 41, a gate electrode 44 of the MOSFET is formed via a gate insulating film 42. The gate electrode 44 is, for example, formed of a polycrystalline Si. On each of the upper surfaces of the impurity diffusion layer 47 and the gate electrode 44, a metal silicide layer 48 is formed. The gate electrode 44 of the MOSFET formed in the dummy element region 13 is not connected to any other circuit, and so it is potential floating.

As a metallic material forming the metal silicide layer 48, a metal that forms a silicide by reacting with the impurity diffusion layer 47 of the Si substrate 21 or the gate electrode 44 (formed of polycrystalline silicon) at a temperature lower than that of Ti or Co, more specifically, Ni or Pt, may be used. In this embodiment, the metal silicide layer 48 is formed of a Ni silicide or a Ni/Ti silicide in which Ti stacked on Ni.

Next, a method of manufacturing an LSI according to the first embodiment will be explained sequentially in accordance with manufacturing steps with reference to. FIGS. 8A to 8M. In this embodiment, steps for forming a single-layer wiring of a memory and logic embedded CMOS LSI will be explained by way of example. More specifically, the step of forming, an n-MOSFET having a lightly doped drain (LDD) structure in the element region 11 and dummy element regions 13, and the step of forming a Ni silicide on each of the real element region 11 and the dummy element regions 13 to reduce the resistivities of the impurity diffusion layer for the source/drain region and the gate electrode, will be explained.

Figure 8A:
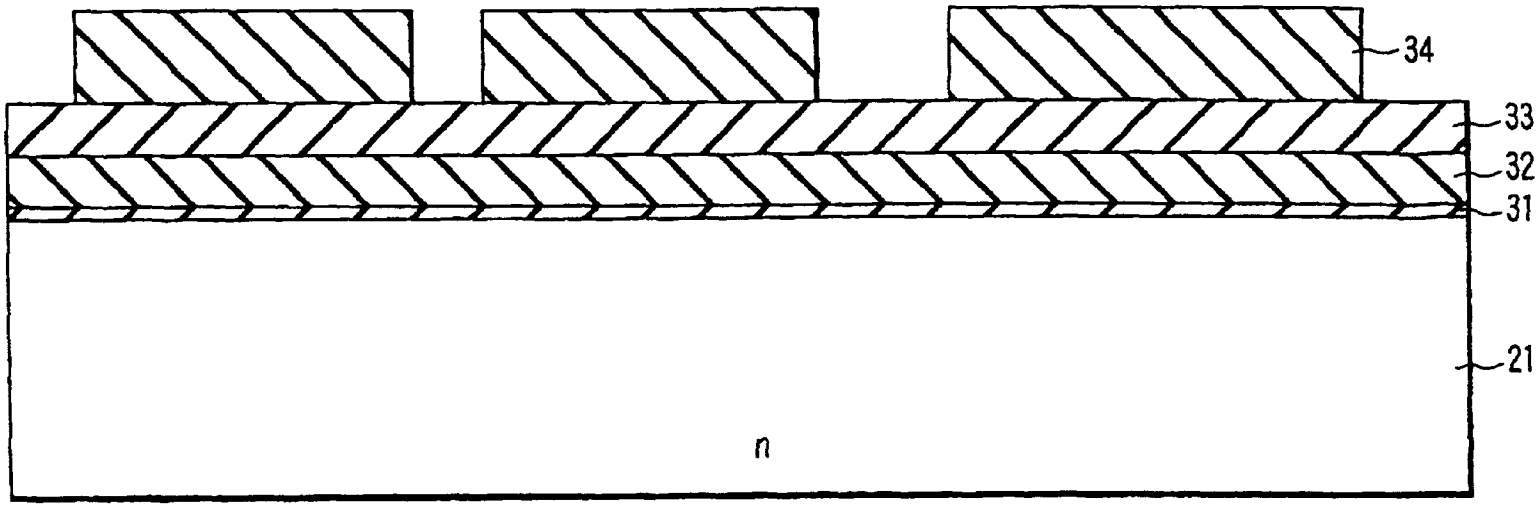
FIGS. 8A to 8M are sectional views showing the steps of a manufacturing method of an LSI according to the first embodiment.

First, as shown in FIG. 8A, on the n-type Si substrate 21, a thermal oxide film such a $SiO_2$ film 31 of, e.g., 10 nm thick is formed by a thermal oxidation method. Subsequently, on the $SiO_2$ film 31, a SiN film 32 of 200 nm thick is formed by an LP-CVD method. Further on the SiN film 32, a $SiO_2$ film 33 of 200 nm thick is formed by the LP-CVD method. Thereafter, a resist pattern 34 is photolithographically formed so as to cover the real element region and the dummy element regions.

Figure 8B:
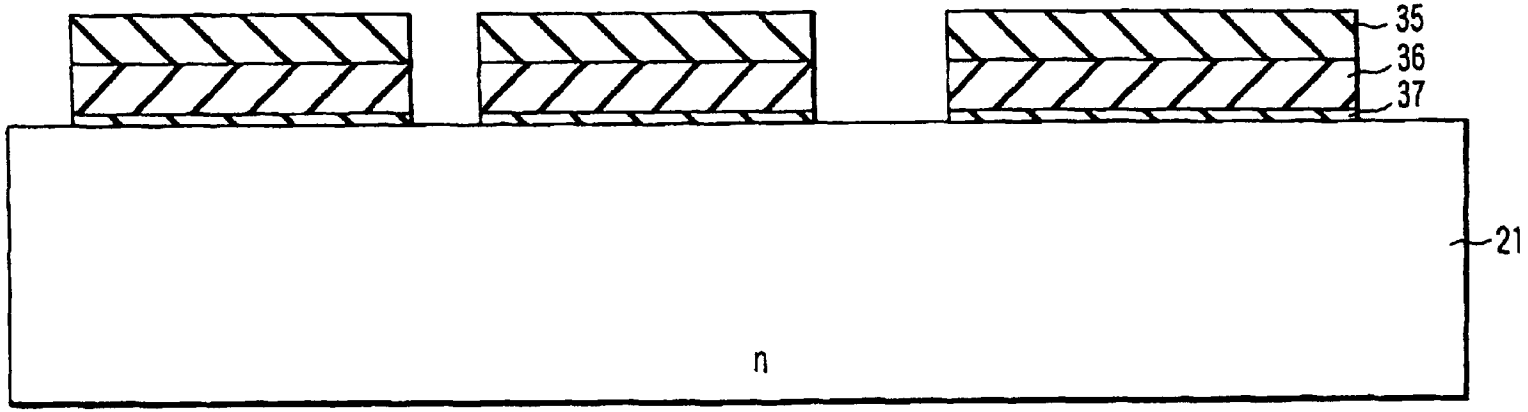

Next as shown in FIG. 8B, the $SiO_2$ film 33 is etched by anisotropic dry etching in which the $SiO_2$ film 33 has a satisfactory etch selectivity to the SiN film 32, with the resist pattern 34 as a mask, thereby forming a $SiO_2$ film pattern 35. Thereafter, the resist 34 is removed.

Furthermore, using the $SiO_2$ pattern 35 as a mask, the SiN film 32 is etched by anisotropic dry-etching in which the SiN film 32 has a satisfactory etch selectivity to an oxide film ($SiO_2$ film 31), thereby forming a SiN film pattern 36. Furthermore, thin $SiO_2$ film 31 is etched to form a $SiO_2$ film pattern 37.

Figures 8C, 8D, 8E:
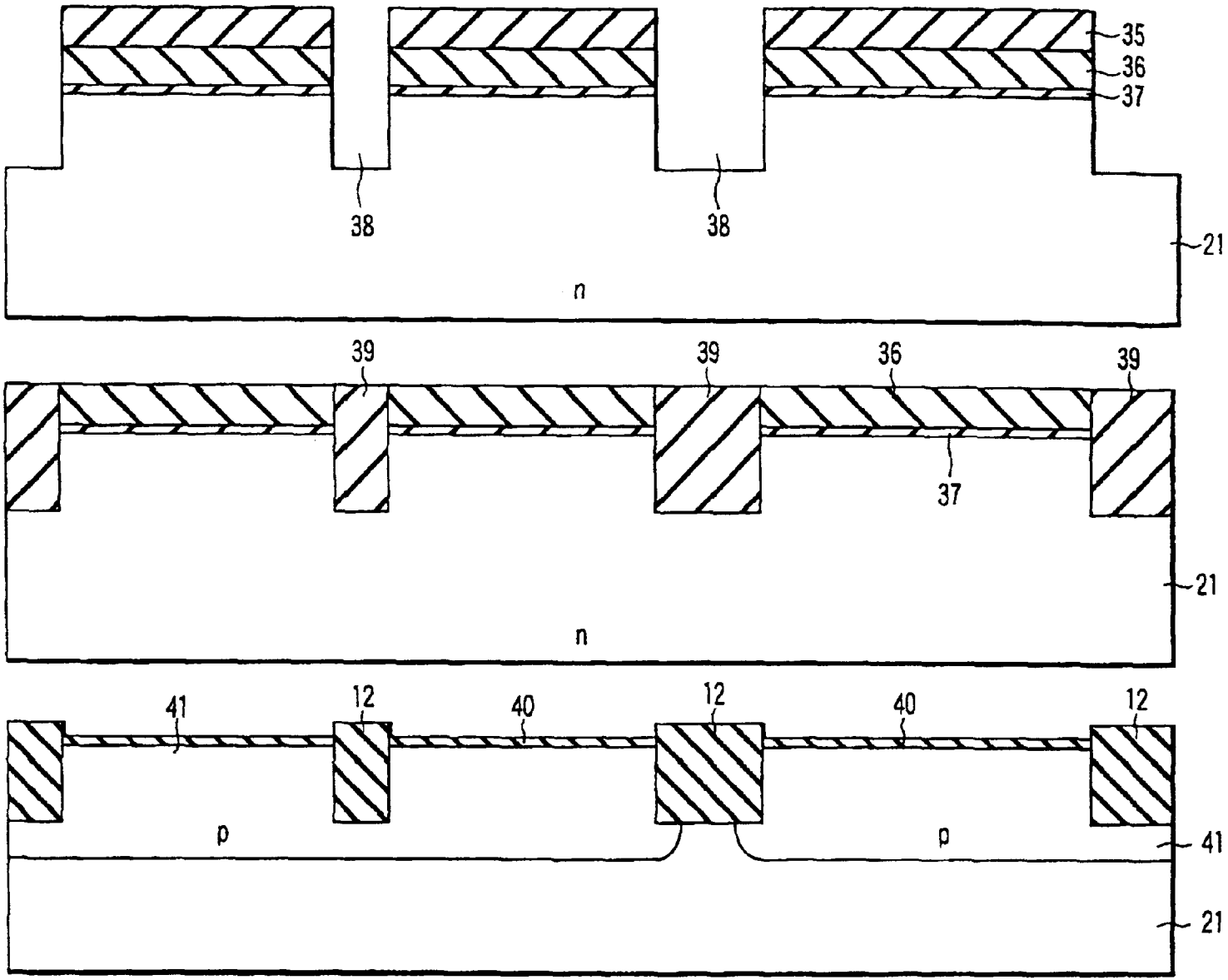

As shown in FIG. 8C, the Si substrate 21 is etched to e.g., a depth of about 0.5 μm by anisotropic dry-etching in which the Si substrate 21 has a satisfactory etch selectivity to an oxide film, thereby forming an STI trench 38.

As shown in FIG. 8D, after a $SiO_2$ film 39 is deposited to a thickness of 1.5 μm by an LP-CVD method, the $SiO_2$ film 39 is planarized by a chemical and mechanical polishing (CMP) in which the $SiO_2$ film has an etch selectivity to a polycrystalline Si. The $SiO_2$ film 39 is left within the trench 38. Thereafter, the $SiO_2$ pattern 35 and $SiO_2$ film 39 are etched with $NH_4F$ or by dry etching until the surface of the SiN pattern 36 is exposed. As a result, an STI 12 is formed of the $SiO_2$ film 39, which is buried in the trench 38.

Thereafter, as shown in FIG. 8E, the SiN pattern 36 is etched away by isotropic dry etching in which the SiN pattern 36 has a satisfactory etch selectivity to an oxide film. Subsequently, thermal processing is performed at, for example, 1000° C. to reduce the stress of the $SiO_2$ film 39 of the STI 12.

Thereafter, the $SiO_2$ film 37 on the Si substrate is etched away by $NH_4F$ and then a sacrificial oxide film 40 is formed of $SiO_2$ by thermal oxidation at 800° C. Subsequently, boron (B) ions are implanted to the real element region and dummy element regions at an acceleration voltage of e.g., about 200 KeV and in a dose amount of about 8E12 $cm^{-2}$, and further B ions are implanted to the real element region and dummy element regions at an acceleration voltage of e.g., about 50 KeV and in a dose amount of about 1E13 $cm^{-2}$ to control the threshold voltage of an n-MOSFET formed in these regions. The impurities thus doped are activated by thermal processing at 1000° C. for 30 seconds to form a p-well 41 in the real element region and dummy element regions.

Figures 8F, 8G, 8H:
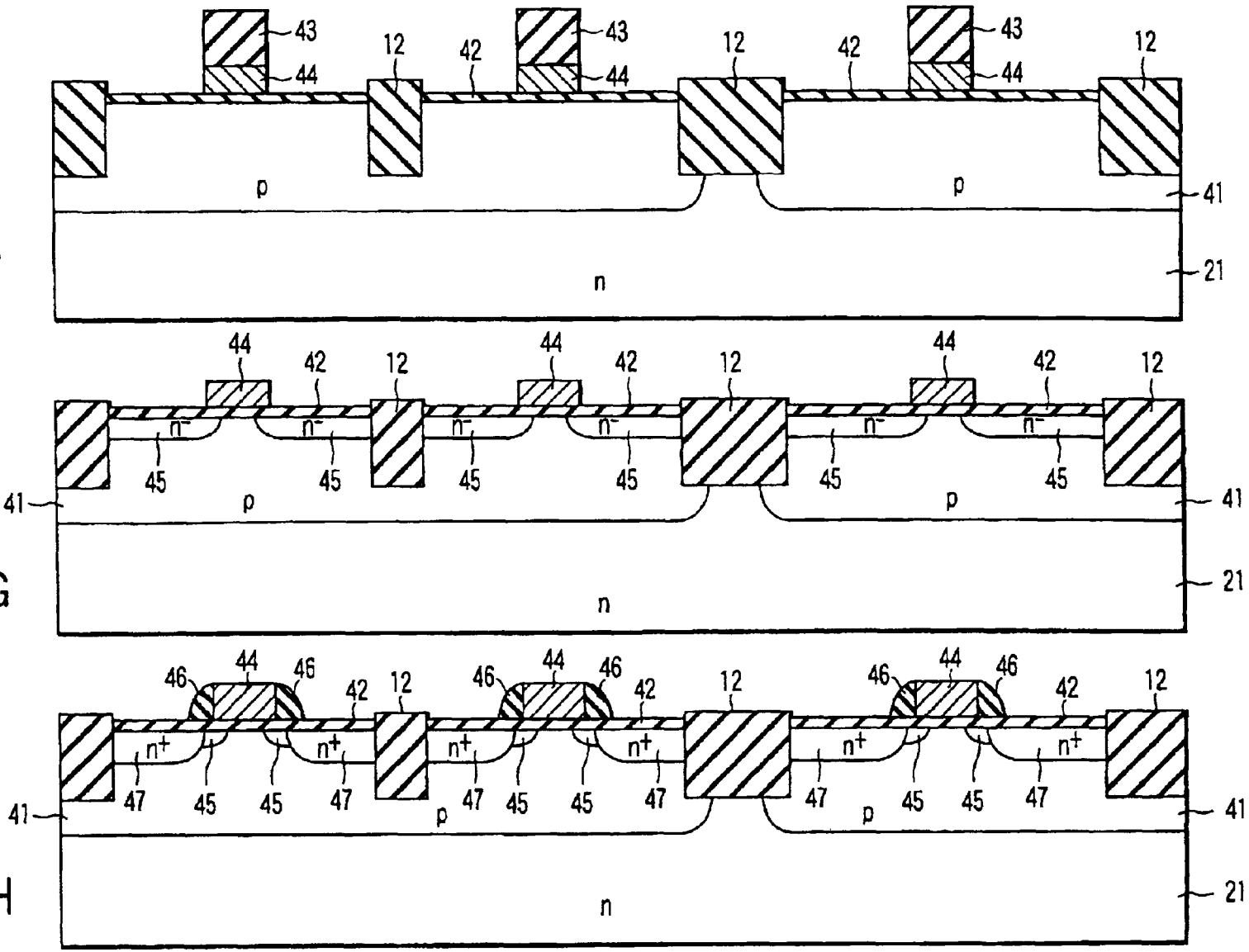

Next, a shown in FIG. 8F, the $SiO_2$ film 40 on the surface of the Si substrate is removed and a gate insulating film 42 of 6 nm thick is formed by a thermal oxidation method. After polycrystalline Si of 300 nm thick is deposited by an LP-CVD method, a resist pattern 43 is formed by a photolithographic method. The polycrystalline Si is etched by anisotropic dry etching in which the polycrystalline Si has a satisfactory etch selectivity to an oxide film to form a gate electrode 44.

After that, the resist pattern 43 is removed and a $SiO_2$ film of e.g., 2 nm thick is formed on the Si substrate by thermal oxidation. Furthermore, as shown in FIG. 8G, for example, arsenic (As) ions are implanted at an acceleration voltage of about 35 keV and in a dose amount of about 2E14 $cm^{-2}$, and subsequently, thermal processing is performed at 1000° C. for 10 seconds in a $N_2$ atmosphere, thereby forming an $n^-$-type shallow extension 45 having a low impurity concentration as part of the source/drain layer of the n-MOSFET.

Thereafter, as shown in FIG. 8H, SiN of 150 nm thick is deposited by an LP-PVD method and the SiN is etched by anisotropic etching in which the SiN has a satisfactory selective ratio to an oxide film, thereby forming a SiN sidewall 46. After that, for example, As ions are implanted at an acceleration voltage of about 60 KeV and in a dose amount of about 5E15 $cm^{-2}$, followed by performing thermal treatment at 1050° C. in a $N_2$ atmosphere while the temperature is increased or decreased at extremely high rate. As a result, an $n^+$-type deep extension 47 having a high impurity-concentration is formed as part of the source/drain diffusion layer, and simultaneously As ions are doped in the gate electrode 44.

Figure 8I:
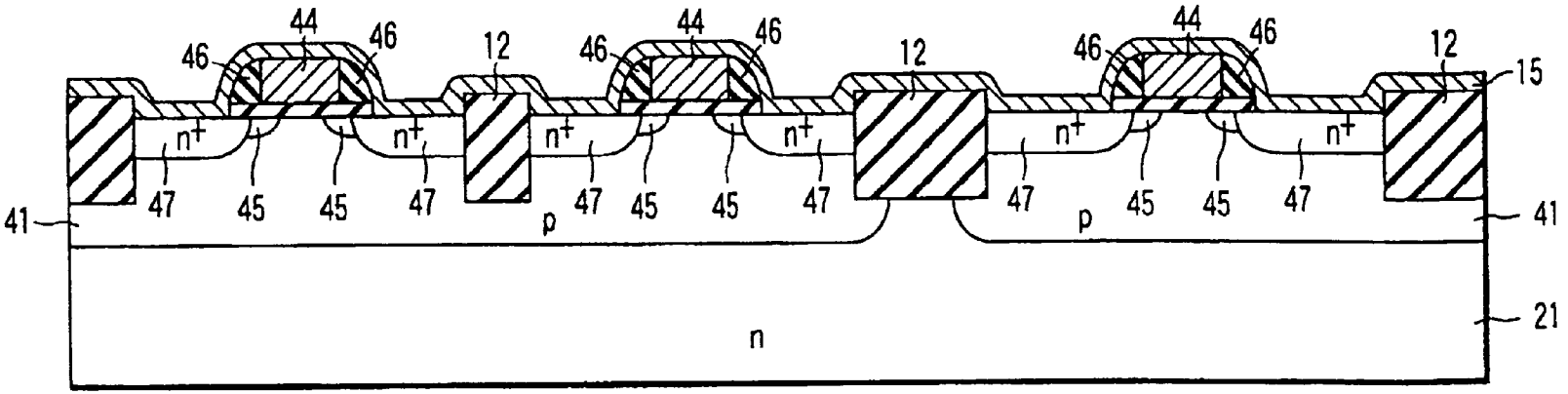

Thereafter, as shown in FIG. 8I, the $SiO_2$ film 42 formed on the source/drain region of the n-MOSFET is removed with $NH_4F$ and, a metal having a high melting-point, for example, Ni 15, is deposited to a thickness of 20 nm.

Figure 8J:
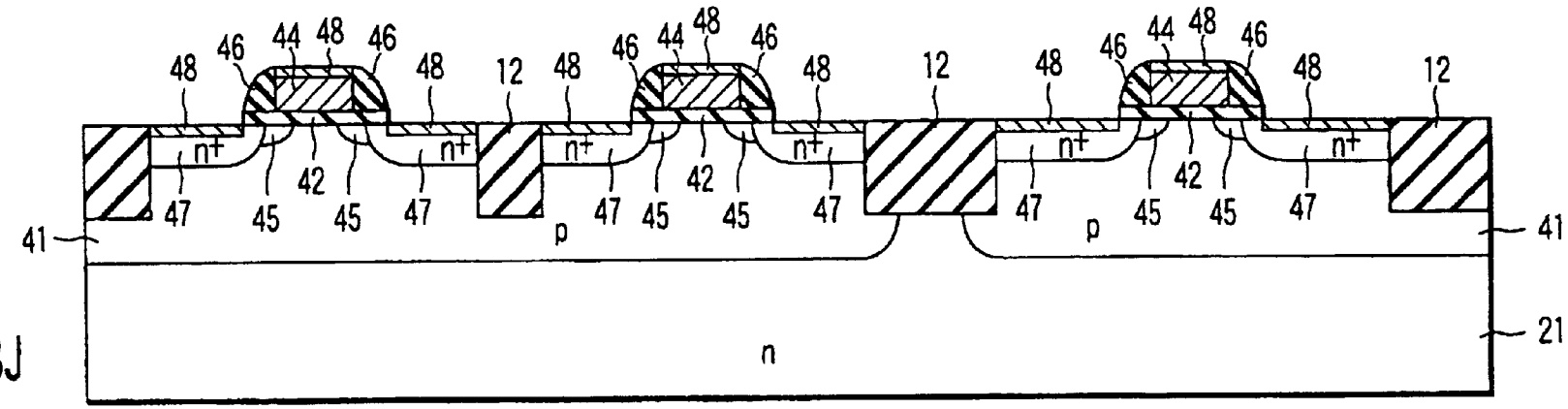

Thereafter, as shown in FIG. 8J, thermal treatment is performed at 500° C. for 10 seconds in a $N_2$ atmosphere, thereby forming a low resistant Ni silicide compound layer 48 on each of the source/drain region 47 and the gate electrode 44. After that, unreacted Ni with Si is removed by a solution mixture of sulfuric acid and hydrogen peroxide.

Figure 8K:
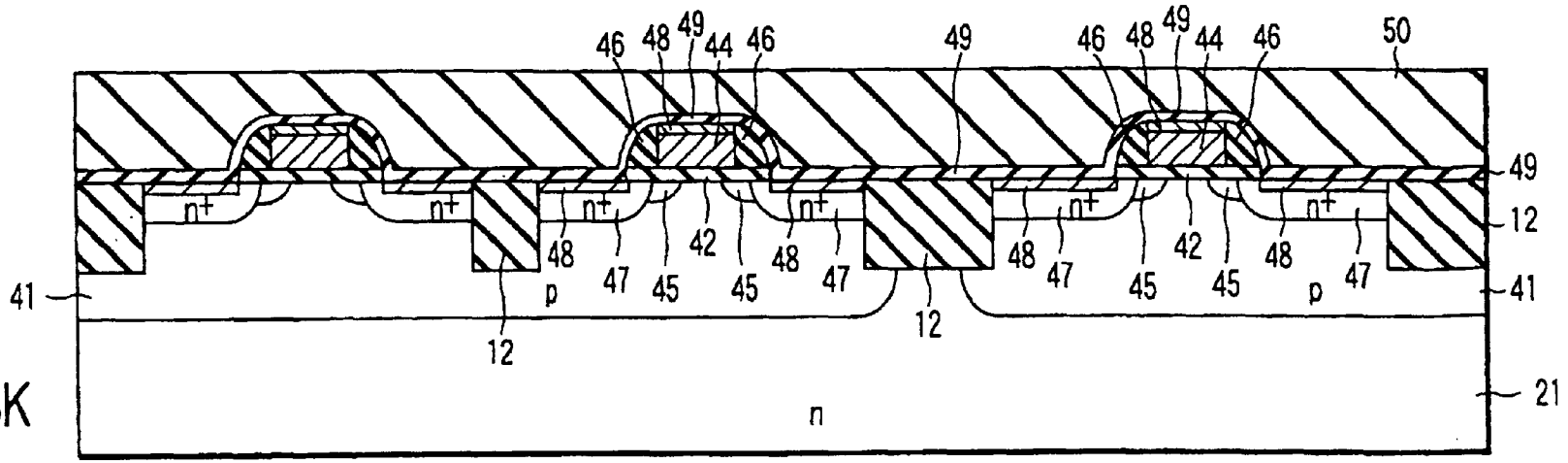

Next, as shown in FIG. 8K, a SiN film 49 of 100 nm thick is deposited, and further, a BPSG film or $SiO_2$ film 50 of 900 nm thick is deposited, and then the surface of the resultant structure is planarized by CMP.

Figure 8L:
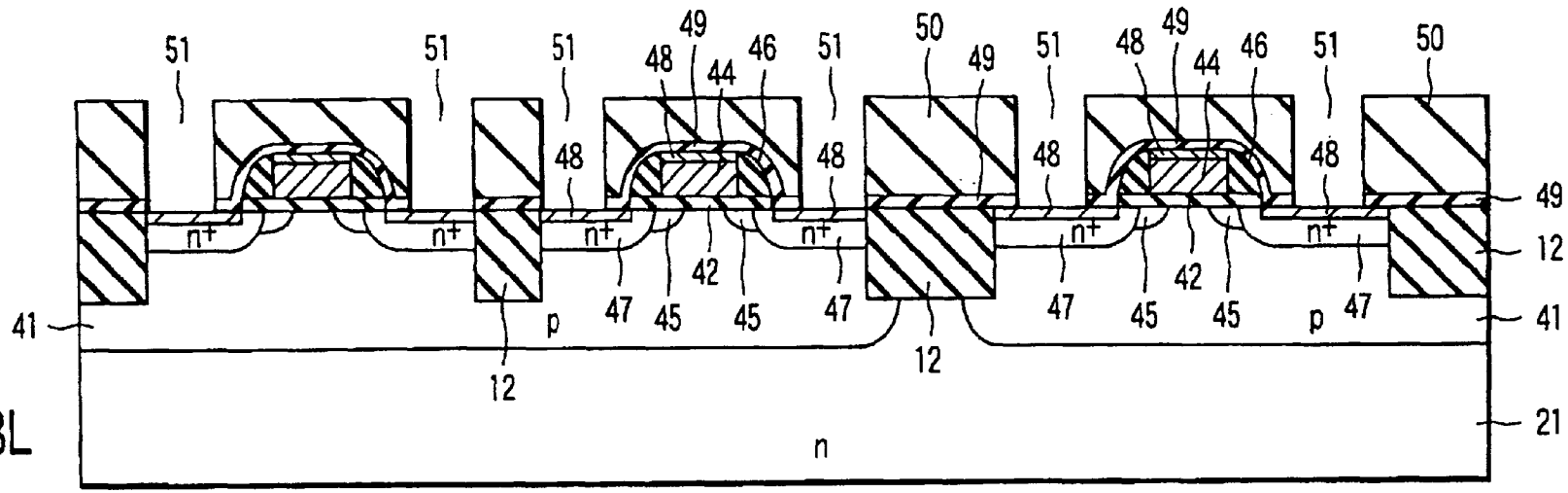

Thereafter, as shown in FIG. 8L, a resist pattern for forming the source/drain contact is formed by a photolithographic method and an opening 51 is formed in the BPSG film 50 by anisotropic etching in which the BPSG film has a satisfactory etch selectivity to the SiN film 49. After that, only the SiN film 49 exposed in the bottom surface of the opening 51 is selectively etched away by anisotropic etching in which the SiN film 49 has a satisfactory etch selectivity to an oxide film.

Figure 8M:
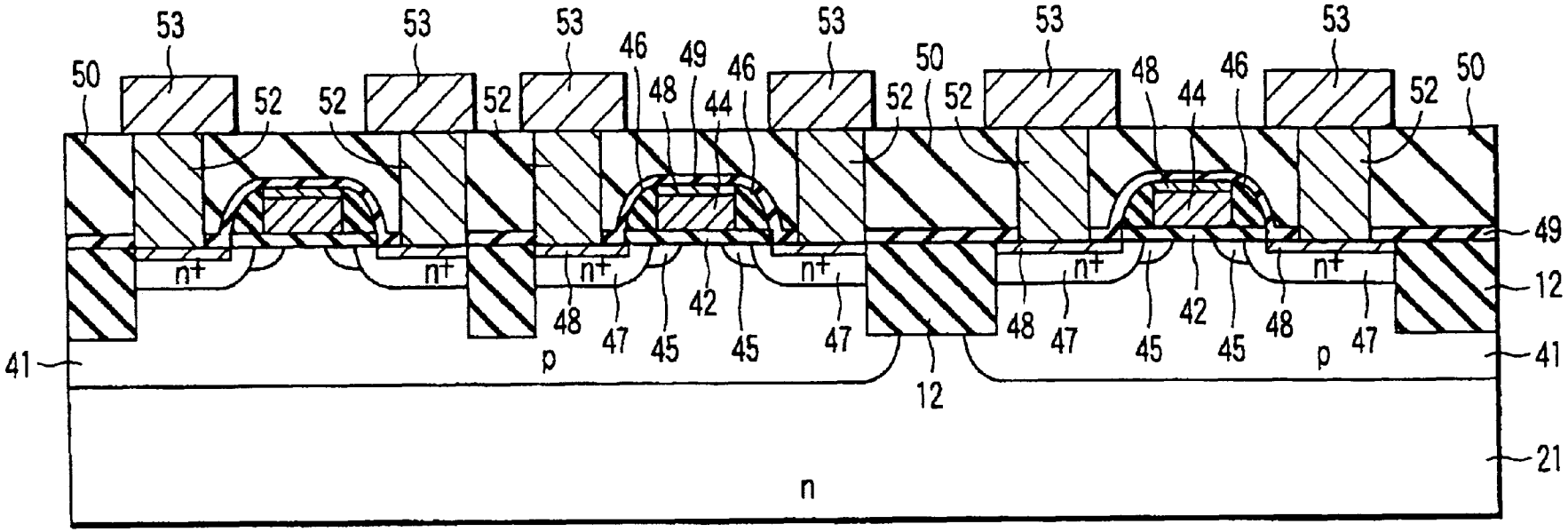

Subsequently, for example, titanium (Ti) is deposited, by a sputtering method, on the bottom of the source/drain contact to a thickness of about 10 nm. Thereafter, thermal processing is performed at 600° C. for 30 minutes in a $N_2$ atmosphere, thereby forming TiN on the surface of Ti. After that tungsten (W) of about 400 nm thick is deposited by a CVD method and then tungsten (W) on the BPSG film 50 is removed by CMP, thereby forming a buried contact 52 in the opening 51 of the source/drain contact, as shown in FIG. 8M. Thereafter, a wiring 53 is formed of, for example, Cu, so as to electrically in contact with the buried contact 52.

In the manufacturing method according to the first embodiment, in order to reduce the resistivity of each of the impurity diffusion layer of the source/drain region 47 formed in the substrate 21 and the gate electrode 44 of polycrystalline Si, a silicide process is performed to produce a reaction product of Ni and Si. At this time, a reaction region is defined in consideration of the diffusion (diffusion coefficient) of Ni in Si during the reaction, thereby suppressing an excessive amount of Ni supply and excessive diffusion of Ni into the reaction region. More specifically, a dummy element region 13 is formed such that the ratio of the reaction region to the region of interest, in other words, the ratio of the region where Si is present immediately under the Ni to the region of interest, is not less than a predetermined lowest value, about 25%, in this embodiment.

When the Ni silicide process is performed in this manner, the dummy element region 13 is formed to prevent an increase in area of the STI 12 (serves as a Ni supply source) surrounding the real element region 11. By virtue of this, excessive supply and diffusion of Ni to the reaction region can be suppressed, thereby preventing a silicide reaction from excessively proceeding in the contact region. As a result, a low resistant Ni silicide compound layer 48 free from contact current leakage is successfully formed.

The semiconductor device manufactured in accordance with the aforementioned method has the STI 12 formed in the Si substrate 21, and the real element region 11 and the dummy element regions 13 formed outside the STI 12. Furthermore, the semiconductor device is formed such that the ratio of the sum of pattern areas of the real element region 11 and the dummy element regions 13 occupied in the region of interest 10 is about 25%. Moreover, the Ni silicide compound layer 48 is formed in each surface of the real element region 11 and the dummy element region 13.

With this structure, a silicide reaction can be suppressed from excessively proceeding in the contact region when a Ni silicide process is performed. Since the presence of a low resistant silicide region causing no contact current leakage, the contact current leakage is suppressed from generating.

Note that, when the area of the real element region 11 is larger than the region of interest 10, as shown in FIG. 5, in other words, the case where the real element region 11 occupies 100% (that is, no less than 25%) of the region of interest 10, the silicide reaction will not take place excessively when the Ni silicide process is performed, as previously mentioned.

<Modified Examples of Semiconductor Device According of the First Embodiment>

In the LSI according to the first embodiment previously mentioned, the real element region 11 and the dummy element regions 13 having the same pattern areas are arranged lengthwise and crosswise at regular intervals, and the ratio of the sum of the pattern areas of the real element region 11 and the dummy element regions 13 occupied in the region of interest 10 is about 25%.

In contrast, a case where the sum of the pattern areas of the real element region 11 and the dummy element regions 13 occupies more than 25% of the region of interest 10 will be explained below as a modified example.

Figure 9:
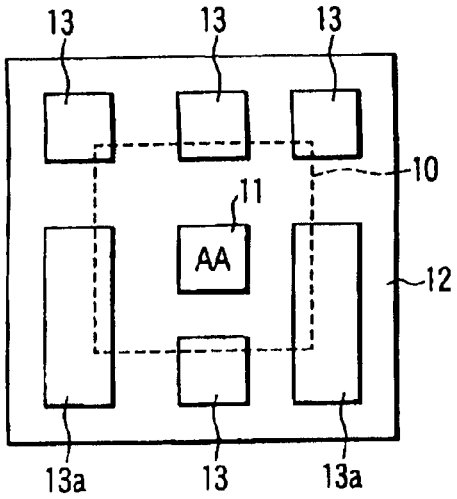
FIG. 9 is a plan view partly showing an STI according to a modified example of the first embodiment.

FIG. 9 shows an arrangement of the STI 12, the real element region 11 and the dummy element regions 13. In this case, the real element region 11 and dummy element regions 13 having the same pattern areas are arranged lengthwise and crosswise at regular intervals, and some of dummy element regions 13a are formed larger than other dummy element regions 13. These real element region 11 and dummy element regions 13, 13a are surrounded by the STI 12.

In this case, the sum of the pattern areas of the real element region 11 and the dummy element regions 13, 13a exceeds 25% of the area of the region of interest 10. As a result, more excellent effect than that of the first embodiment is expected.

Figure 10:
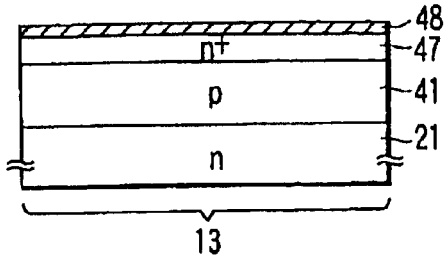
FIG. 10 is a sectional view of an STI according to a second modified example of the first embodiment.

FIG. 10 shows a schematic structure of the dummy element region 13 of an LSI according to a second modified example of the first embodiment.

In the dummy element region 13, the impurity diffusion layer 47 is formed over the entire surface of the well 41. On the upper surface of the impurity diffusion layer 47, a Ni silicide compound layer 48 is formed.

Figure 11:
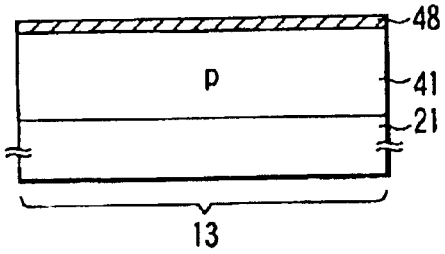
FIG. 11 is a sectional view of an STI according to a third modified example of the first embodiment.

FIG. 11 shows a schematic structure of the dummy element region 13 of an LSI according to a third modified example of the first embodiment.

In the dummy element region 13, the Ni silicide compound layer 48 is formed on the surfaced of the well 41 itself. In this case, if the same conductivity-type impurity as used in the substrate 21 is used in the well 41, the potential of the Ni silicide compound layer 48 may be set at the same as that of the well 41. Therefore, different from the case where the conductivity-type of the impurities doped in the substrate 21 differs from that of the well 41, the well 41 is potentially floating. Therefore, an unstable parasitic capacitance is not produced and thus a highly controllable element can be designed.

Figure 12:
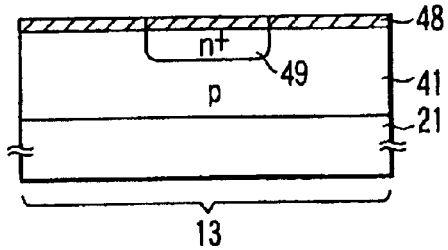
FIG. 12 is a sectional view of an STI according to a fourth modified example of the first embodiment.

FIG. 12 shows a schematic structure of the dummy element region 13 of an LSI according to a fourth modified example of the first embodiment. In the dummy region 13, an impurity diffusion layer 49 for well contact is locally formed in the surface portion of the well 41. On each surface of the well 41 and the impurity diffusion layer 49, Ni silicide compound layer 48 is formed.

<Semiconductor Device of Second Embodiment>

Figure 13:
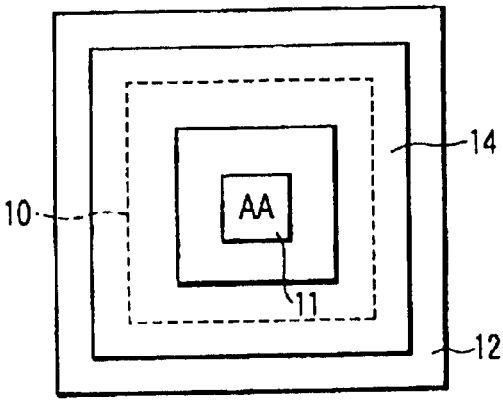
FIG. 13 is a plan view of a pattern showing part of a memory and logic embedded CMOS LSI according to a second embodiment of the present invention.

FIG. 13 shows a plan view of an LSI pattern of a memory and logic embedded CMOS LSI according to the second embodiment. The LSI of this embodiment is substantially the same as that of the first embodiment shown in FIG. 6, except that the dummy gate electrode 14 is formed, as the dummy element region 13, on the Si substrate via a gate insulating film, in order to define the reaction region in which the Ni silicide process is performed, and except that the lowermost ratio of the reaction region to the region of interest is defined. Like reference numerals are used to designate like structural elements corresponding to those of the structure shown in FIG. 6, and any further explanation is omitted. Note that the dummy gate electrode 14 is not connected to any portion and is electrically floating.

Even if such a structure is employed, excessive supply and diffusion to the reaction region of the real element region 11 can be suppressed during the silicide reaction, in the same manner as in the first embodiment, thereby suppressing excessive silicide reaction from taking place in the contact region. As a result, a low resistant silicide region free from contact current leakage can be formed.

<Semiconductor Device of Third Embodiment>

The dummy element region 13 is formed in the first embodiment in order to define the lowermost ratio of the reaction region occupied in the region of interest. The dummy electrode 14 is formed in the second embodiment in order to define the lowermost ratio of the reaction region occupied in the region of interest.

Whereas in the third embodiment, the first and second embodiments are combined. More specifically, the dummy element region 13 and the dummy electrode 14 are formed in order to define the lowermost ratio of the reaction region occupied in the region of interest.

Figure 14:
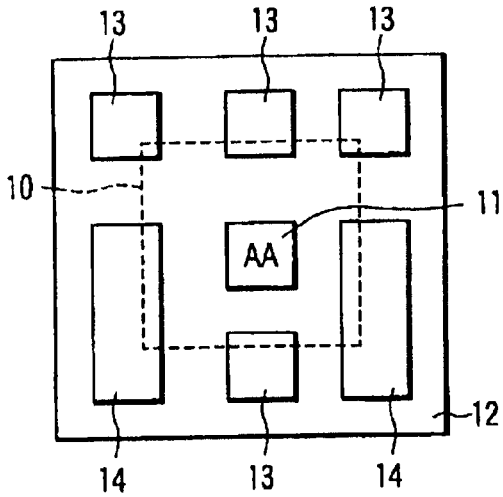
FIG. 14 is a plan view of a pattern showing part of a memory and logic embedded CMOS LSI according to a third embodiment of the present invention.

FIG. 14 shows a schematic plan-view of the pattern in which the STI 12, dummy element regions 13 and dummy gate electrodes 14, which are arranged on a semiconductor substrate in the LSI of the third embodiment.

Even if the structure shown in FIG. 14 is employed, excessive supply and diffusion of Ni to the reaction region can be suppressed during the silicide reaction in the same manner as in the first embodiment. Since the excessive silicide reaction is suppressed in the contact region, a low resistant silicide region free from contact current leakage can be formed.

<Other Embodiments of Method of Manufacturing Semiconductor Device>

When semiconductor devices according to the first to third embodiments are manufactured, the dummy element region 13 and/or the dummy gate electrode 14 are formed in order to define the lowermost ratio of the reaction region for Ni silicide process occupied in the region of interest.

Alternatively, after a metal causing an excessive Ni-silicide reaction is previously removed from an unreaction region, the Ni silicide process may be performed to define of the lowermost ratio of the reaction region occupied in the region of interest.

To describe more specifically, first, the steps shown in FIGS. 8A to 8I are carried out in the same manner as in the manufacturing method of the first Embodiment, thereby depositing the Ni layer 15 over the semiconductor substrate.

Figure 15:
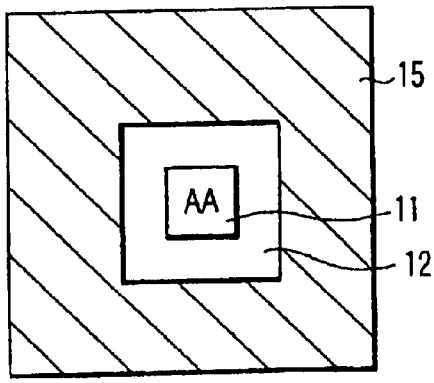
FIG. 15 is a plan view of a pattern showing part of a memory and logic embedded CMOS LSI according to a fourth embodiment of the present invention.

Subsequently, before a Ni silicide compound is formed, a step for removing part of the Ni layer 15 formed on the STI 12 surrounding the real element region 11 is performed, as shown in FIG. 15. In this manner, the ratio of the pattern area of the Ni layer 15, which is formed on the real element region 11 and the STI 12, occupied in the region of interest (1 μm-square) including the real element region 11, is set at 25% or more.

Thereafter, in the same manner as in the manufacturing method of the first embodiment, heat processing is formed at 500° C. for 10 seconds in an $N_2$ atmosphere to form a low resistant Ni silicide compound layer. Thereafter, the same steps as in the first embodiment are repeated.

According to the method of manufacturing a semiconductor device, a silicide process is performed after Ni causing an extra reaction is removed from the unreacted region such that the ratio of the reaction region occupied in the region of interest is the lowermost value or more. In this manner, in the same manner as in the manufacturing method of the first embodiment, excessive supply and diffusion of Ni to the reaction region can be suppressed during the silicide reaction. As a result, an excessive silicide reaction can be suppressed form taking place in the contact region, enabling the formation of a low resistant silicide region free from contact current leakage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a semiconductor substrate;

an element-isolating region formed in the semiconductor substrate; and a plurality of element regions formed in the semiconductor substrate and outside the element-isolating region and having a metal silicide layer formed on the surface thereof, said plurality of element regions including a real element region and at least one dummy element region, wherein the ratio of the sum of pattern areas of the real element region and said at least one dummy element region occupied in a 1 μm square range of interest including the element region is 25% or more.

2. The semiconductor device according to claim 1, wherein each of the real element region and said at least one dummy element region comprises a well having a channel region;

a first impurity diffusion layer formed in a surface region of the well;

a gate electrode formed on the channel region of the well via a gate insulating film; and a metal silicide layer formed on each of the first impurity diffusion layer and the gate electrode.

3. The semiconductor device according to claim 1, wherein said at least one dummy element region comprises a well;

a first impurity diffusion layer formed over an entire surface of the surface region of the well; and the metal silicide layer formed on an upper surface of the first impurity diffusion layer.

4. The semiconductor device according to claim 1, wherein said at least one dummy element region comprises a well; and the metal silicide layer formed on the well.

5. The semiconductor device according to claim 1, wherein said at least one dummy element region comprises a well;

a second impurity diffusion layer for well contact formed in a surface region of the well; and the metal silicide layer formed on the well and the second impurity diffusion layer.

6. The semiconductor device according to claim 1, wherein said at least one dummy element region includes a dummy gate electrode.

7. The semiconductor device according to claim 1, wherein the metal silicide layer contains either one of metals, Ni and Pt.

8. The semiconductor device according to claim 1, wherein the element-isolating region comprises a trench formed in the semiconductor substrate; and an insulating film burying within the trench.

*9. A semiconductor device, comprising:*

*a semiconductor substrate;*

*an element-isolating region formed in the semiconductor substrate; and*

*a plurality of element regions formed in the semiconductor substrate, isolated by the element-isolating region and having a metal silicide layer, including a real element region and*

*at least one dummy element region,*

*wherein a ratio of a sum of an area of the real element region and an area of said at least one dummy element region occupied in a 1 μm square region containing the real element region and at least a portion of said at least one dummy element region is at least 25%.*

*10. The semiconductor device according to claim 9, comprising:*

*a plurality of dummy element regions, wherein portions of a plurality of said dummy element regions are included in said square region, and a ratio of a sum of an area of the real element region to a sum of areas of said portions of said dummy element regions is 25% or more.*

*11. The semiconductor device according to claim 10, comprising:*

*at least one of said dummy regions having a shape different than a shape of said real element region.*

*12. The semiconductor device according to claim 10, comprising:*

*an area of at least one of said dummy regions being larger than an area of said real element region.*

*13. The semiconductor device according to claim 9, comprising:*

*at least one of said dummy regions having a shape different than a shape of said real element region.*

*14. The semiconductor device according to claim 9, comprising:*

*an area of at least one of said dummy regions being larger than an area of said real element region.*

*15. The semiconductor device according to claim 9, wherein:*

*said real element region comprises a first transistor; and*

*said dummy element region comprises a second transistor.*

*16. The semiconductor device according to claim 15, wherein:*

*each of said first and second transistors includes a gate electrode.*

*17. The semiconductor device according to claim 9, wherein at least one of the real element region and said at least one dummy element region comprises:*

*a channel region;*

*a gate electrode formed on the channel region via a gate insulating film;*

*a diffusion region; and*

*a metal silicide layer formed on each of the diffusion region and the gate electrode.*

*18. The semiconductor device according to claim 9, wherein said at least one dummy element region comprises a well, and the metal silicide layer is formed on the well.*

*19. The semiconductor device according to claim 9, wherein said at least one dummy element region comprises a well, an impurity diffusion layer for a well contact is formed in a surface region of the well, and the metal silicide layer is formed on the well and the impurity diffusion layer.*

*20. The semiconductor device according to claim 9, wherein said at least one dummy element region includes a dummy gate electrode.*

*21. The semiconductor device according to claim 9, wherein the metal silicide layer contains either one of Ni and Pt.*

*22. The semiconductor device according to claim 9, wherein the element-isolating region comprises a trench formed in the semiconductor substrate, and insulating film is buried within the trench.*

*23. The semiconductor device according to claim 9, comprising:*

*said square region being approximately centered on the real element region and including at least a portion of said at least one dummy region.*

*24. The semiconductor device according to claim 23, comprising:*

*said at least one dummy region surrounding said real element region.*

*25. The semiconductor device according to claim 9, comprising:*

*said at least one dummy region surrounding said real element region.*

*26. The semiconductor device according to claim 9, wherein each of said real element region and said at least one dummy region comprises the same area.*

*27. The semiconductor device according to claim 9, comprising:*

*said ratio being approximately 25%.*

*28. A semiconductor device, comprising:*

*a semiconductor substrate;*

*an element-isolating region formed in the semiconductor substrate;*

*an element region formed in the semiconductor substrate, isolated by the element-isolating region, and having a metal silicide layer with a first area; and*

*at least one dummy region formed in the semiconductor substrate, and having a metal silicide layer with a second area,*

*wherein a ratio of a sum of the first and second areas occupied in said in a 1 μm square region containing the element region and at least a portion of said at least one dummy region, is at least 25%.*

*29. The semiconductor device according to claim 28, comprising:*

*a plurality of dummy element regions, wherein portions of a plurality of said dummy regions are included in said square region.*

*30. The semiconductor device according to claim 28, comprising:*

*at least one of said dummy regions having a shape different than a shape of said real element region.*

*31. The semiconductor device according to claim 28, comprising:*

*an area of at least one of said dummy regions being larger than an area of said real element region.*

*32. The semiconductor device according to claim 28, comprising:*

*at least one of said dummy regions having a shape different than a shape of said real element region.*

*33. The semiconductor device according to claim 28, comprising:*

*an area of at least one of said dummy regions being larger than an area of said real element region.*

*34. The semiconductor device according to claim 28, comprising:*

*said square region being approximately centered on the real element region and including at least a portion of said at least one dummy region.*

*35. The semiconductor device according to claim 28, comprising:*

*said dummy region surrounding said real element region.*

*36. The semiconductor device according to claim 28, wherein each of said real element region and said at least one dummy region comprises the same area.*

*37. A semiconductor device having a semiconductor substrate, an element-isolating region formed in the semiconductor substrate, a plurality of element regions formed in the semiconductor substrate, isolated by the element-isolating region and having a metal silicide layer, including a real element region and at least one dummy element region, formed by a method comprising:*

*forming said real element region and at least a portion of said dummy element region in a 1 μm square region where a ratio of a sum of an area of the real element region and an area of said at least one dummy element region occupied in said square region is 25% or more.*

*38. The semiconductor device according to claim 37, wherein said device is formed by said method comprising:*

*forming a trench;*

*filling said trench with an insulating layer;*

*forming a first diffusion region in said real element region;*

*forming a second diffusion region in said at least one dummy element region;*

*forming a Ni layer over said first and second diffusion regions and said insulating layer; and*

*forming a silicide layer on said first and second diffusion regions.*

*39. A semiconductor, comprising:*

*a semiconductor substrate;*

*an element-isolating region formed in the semiconductor substrate;*

*a real element region formed in the semiconductor substrate, isolated by the element-isolating region and having a metal silicide layer; and*

*means for decreasing an area occupied by said element-isolating region in a 1 micron square region containing said real element region if an area of said real element region is less than 25% of an area of said square region.*

*40. The semiconductor device according to claim 39, wherein said means comprises at least one dummy element region, wherein at least a portion of said at least one dummy element region is included in said square region.*

*41. The semiconductor device according to claim 40, wherein said at least one dummy element region has a shape different than a shape of said real element region.*

*42. The semiconductor device according to claim 40, comprising:*

*an area of said at least one dummy element region being larger than an area of said real element region.*

*43. The semiconductor device according to claim 40, wherein each of said real element region and said means comprises the same area.*

*44. The semiconductor device according to claim 40, wherein the metal silicide layer contains either one of Ni and Pt.*

*45. The semiconductor device according to claim 40, wherein the real element region includes a diffusion region on which the metal silicide layer is formed.*

*46. The semiconductor device according to claim 40, wherein said device is formed by said method comprising:*

*forming a trench;*

*filling said trench with an insulating layer;*

*forming a first diffusion region in said real element region;*

*forming a second diffusion region in said at least one dummy element region;*

*forming a Ni layer over said first and second diffusion regions and said insulating layer; and*

*forming a silicide layer on said first and second diffusion regions.*

*47. The semiconductor device according to claim 39, comprising:*

*said means having a shape different than a shape of said real element region.*

*48. The semiconductor device according to claim 39, comprising said means occupying an area larger than an area of said real element region.*

*49. The semiconductor device according to claim 39, comprising:*

*said square region being approximately centered on the real element region.*

*50. The semiconductor device according to claim 39, comprising:*

*said means surrounding said real element region.*

* * * * *